US006075935A

United States Patent [19]
Ussery et al.

[11] Patent Number: 6,075,935
[45] Date of Patent: Jun. 13, 2000

[54] METHOD OF GENERATING APPLICATION SPECIFIC INTEGRATED CIRCUITS USING A PROGRAMMABLE HARDWARE ARCHITECTURE

[75] Inventors: Cary Ussery, Hamilton, Mass.; Oz Levia, Sunnyvale; Raymond Ryan, San Jose, both of Calif.

[73] Assignee: Improv Systems, Inc., Beverly, Mass.

[21] Appl. No.: 08/980,631

[22] Filed: Dec. 1, 1997

[51] Int. Cl.[7] .................................. G06F 3/00; G06F 9/45
[52] U.S. Cl. .............................. 395/500.18; 395/500.17; 395/500.13; 395/500.19; 395/705; 395/707
[58] Field of Search ................................. 395/705, 800, 395/500.18, 500.17

[56] References Cited

U.S. PATENT DOCUMENTS

| | | | |
|---|---|---|---|
| 5,021,945 | 6/1991 | Morrison et al. ................... | 364/200 |
| 5,057,837 | 10/1991 | Colwell et al. ..................... | 341/55 |
| 5,127,092 | 6/1992 | Gupta et al. ....................... | 395/375 |
| 5,151,991 | 9/1992 | Iwasawa et al. .................... | 395/700 |
| 5,197,016 | 3/1993 | Sugimoto et al. ................ | 395/500.19 |
| 5,287,548 | 2/1994 | Flood et al. ........................ | 395/375 |
| 5,293,631 | 3/1994 | Rau et al. .......................... | 395/700 |
| 5,317,734 | 5/1994 | Gupta ................................ | 395/650 |
| 5,361,373 | 11/1994 | Gilson ............................... | 712/1 |
| 5,367,648 | 11/1994 | Chuang et al. .................... | 395/375 |
| 5,367,685 | 11/1994 | Gosling ............................. | 395/707 |
| 5,432,937 | 7/1995 | Tevanian et al. ................... | 395/700 |
| 5,442,760 | 8/1995 | Rustad et al. ...................... | 395/375 |
| 5,442,790 | 8/1995 | Nosenchuck ...................... | 395/700 |
| 5,452,461 | 9/1995 | Umekita et al. ................... | 395/700 |
| 5,465,368 | 11/1995 | Davidson et al. ................. | 395/800 |
| 5,471,593 | 11/1995 | Branigin ............................ | 395/375 |
| 5,481,736 | 1/1996 | Schwartz et al. ................. | 395/800 |
| 5,517,628 | 5/1996 | Morrison et al. ................ | 395/375 |
| 5,517,656 | 5/1996 | Shi ...................................... | 395/800 |
| 5,524,244 | 6/1996 | Robinson et al. ................. | 395/705 |
| 5,524,253 | 6/1996 | Pham et al. ....................... | 395/800 |
| 5,535,342 | 7/1996 | Taylor ................................ | 710/127 |
| 5,542,075 | 7/1996 | Ebcioglu et al. ................. | 395/700 |
| 5,555,428 | 9/1996 | Radigan et al. ................... | 395/800 |
| 5,557,797 | 9/1996 | Yano ................................... | 395/650 |
| 5,561,801 | 10/1996 | Simons et al. .................... | 395/700 |
| 5,581,773 | 12/1996 | Glover ............................... | 395/800 |
| 5,600,810 | 2/1997 | Ohkami .............................. | 395/567 |
| 5,603,043 | 2/1997 | Taylor et al. ...................... | 712/1 |
| 5,604,905 | 2/1997 | Tevanian et al. .................. | 395/706 |
| 5,625,797 | 4/1997 | Ferry et al. ........................ | 711/214 |

FOREIGN PATENT DOCUMENTS

WO94/10627  5/1994  WIPO ............................ G06F 5/00

OTHER PUBLICATIONS

G. Essink et al., "Scheduling in Programmable Video Signal Processors" Digest of Technical Papers of the IEEE Int'l Conference on Computer–Aided Design, Nov. 11–14, 1991, Santa Clara, California, pp. 284–287.

(List continued on next page.)

Primary Examiner—Tariq R. Hafiz
Assistant Examiner—Kelvin E. Booker
Attorney, Agent, or Firm—Testa, Hurwitz & Thibeault, LLP

[57] ABSTRACT

A method for generating an application specific integrated circuit including providing a software configurable semiconductor integrated circuit having a fixed hardware architecture that includes a plurality of task engines. A high-level language compiler is provided that compiles a user created high-level language program that defines the application specific integrated circuit. The compiler parses the program into a plurality of microtasks for instructing the plurality of task engines to implement the application specific integrated circuit.

19 Claims, 5 Drawing Sheets

OTHER PUBLICATIONS

P. Hoang et al., "A Compiler for Multiprocessor DSP Implementation" ICASSP–92, vol. 5, IEEE Int'l Conference on Acoustics, Speech and Signal Processing, Mar. 23–26, 1992, San Francisco, California, pp. V–581–584.

G. Mirchandani et al., "Generation and Implementation of DSP Parallel Programs from A Signal Processing Design Environment" ICASSP–92, vol. 5, IEEE Int'l Conference on Acoustics, Speech and Signal Processing, Mar. 23–26, 1992, San Francisco, California, pp. V–577–580.

Kamal S. Ali and Adel L. Ali, "Application Specific Integrated Circuit Design on a PC Platform", Computers Industrial Engineering, vol. 31, No. 1/2, pp. 123–126, Sep. 1996.

Douglas Kramer, "The Java Platform: A White Paper", Sun Microsystems—www.sun.com, May 1996.

Rachid Helaihel and Kunle Olukotun, "Java as a Specification Language for Hardware–Software Systems", IEEE/ACM International Conference—WWW.IEEE.org, Sep. 1997.

Simon R. Wiseman and Hugh S Field–Richards, "Holistic computing", Defence Research Agency, Jul. 1994.

METHOD OF GENERATING APPLICATION SPECIFIC INTEGRATED CIRCUITS USING A PROGRAMMABLE HARDWARE ARCHITECTURE

FIELD OF THE INVENTION

The invention relates generally to the field of application specific integrated circuits. In particular, the invention relates to methods of generating application specific integrated circuits using a fixed but configurable hardware architecture.

BACKGROUND OF THE INVENTION

Custom integrated circuits are widely used today in the electronics industry. The demand for custom integrated circuits is rapidly increasing because of a dramatic growth in the demand for highly specific consumer electronics and a trend towards increased product functionality. Also, the use of custom integrated circuits is advantageous because they reduce system complexity and, therefore, lower manufacturing costs, increase reliability and increase system performance.

There are numerous types of custom integrated circuits. One type is programmable logic devices (PLDs) including field programmable gate arrays (FPGAs). FPGAs are designed to be programmed by the end user using special-purpose equipment. Programmable logic devices are, however, undesirable for many applications because they operate at relatively slow speeds, have relatively low capacity, and have relatively high cost per chip.

Another type of custom integrated circuit is application-specific integrated circuits (ASICs) including gate-array based and cell-based ASICs which are often referred to as "semicustom" ASICs. Semicustom ASICs are programmed by either a) defining the placement and interconnection of a collection of predefined logic cells which are used to create a mask for manufacturing the IC (cell-based) or b) defining the final metal interconnection layers to lay over a pre-defined pattern of transistors on the silicon (gate-array-based). Semicustom ASICs can achieve high performance and high integration but can be undesirable because they have relatively high design costs, have relatively long design cycles (time it takes to transform given functionality into a mask), and relatively low predictability of integrating into an overall electronic system.

Another type of custom integrated circuit is referred to as application-specific standard parts (ASSPs) which are non-programmable integrated circuits that are designed for specific applications. These devices are typically purchased off-the-shelf from integrated circuit suppliers. ASSPs have predetermined architectures and input and output interfaces. They are typically designed for specific products and, therefore, have short product lifetimes.

Yet another type of custom integrated circuit is referred to as a software-only design. This type uses a general purpose processor and a high-level compiler. The end user programs the desired functions with a high-level language. The compiler generates the machine code that instructs the processor to perform the desired functions. Software-only designs typically require general-purpose hardware to perform the desired function. In addition, software only designs have relatively poor performance because the hardware is not optimized to perform the desired functions.

Figure 1:
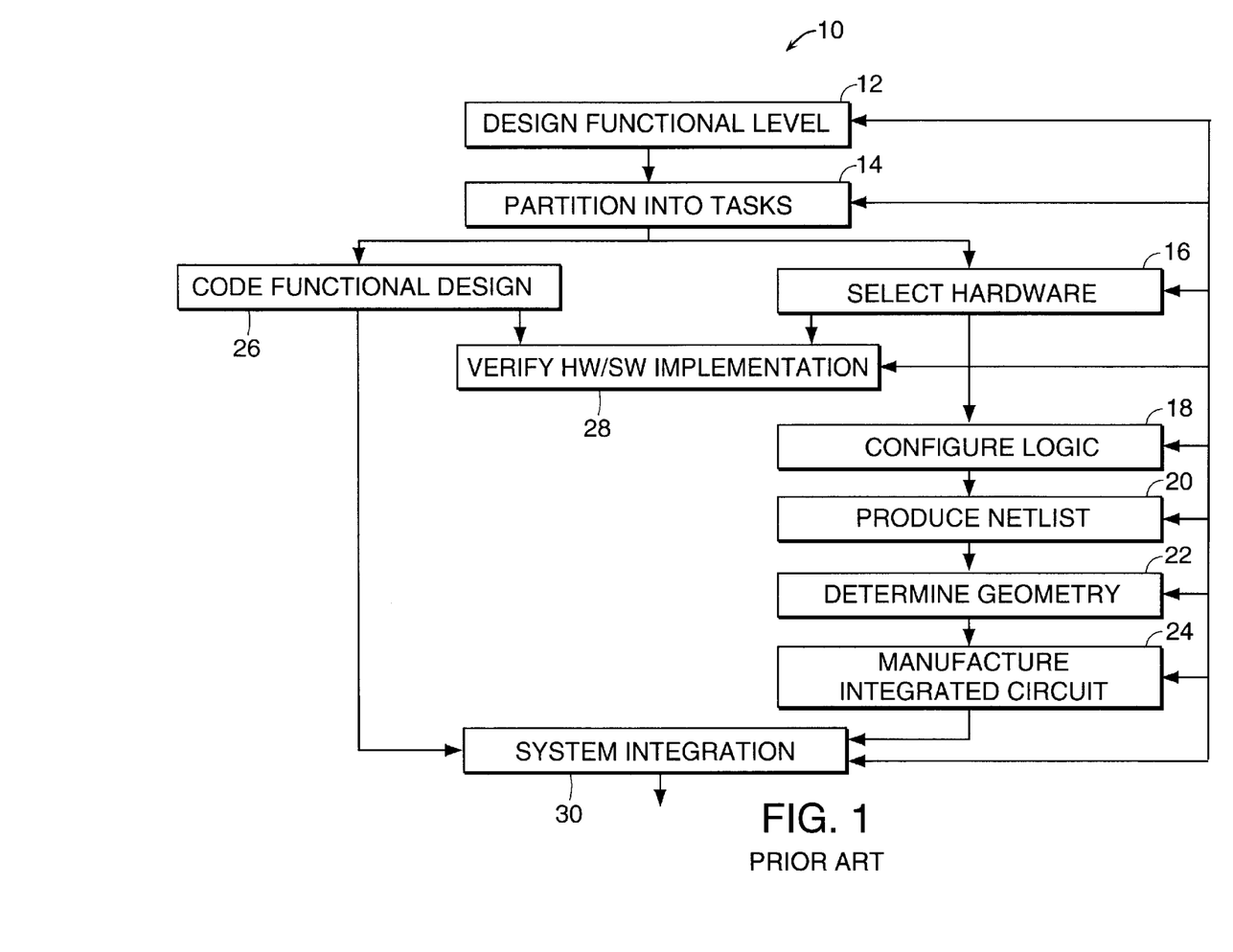
FIG. 1 illustrates a flow chart of a prior art custom integrated circuit design cycle.

FIG. 1 illustrates a flow chart of a prior art custom integrated circuit design cycle 10. The first step 12 is to design the system at a functional level. A system partitioning step 14 partitions the functional design into a plurality of tasks. A hardware implementation step 16 selects the hardware for the design. A gate level design step 18 configures the logic to implement the hardware design. A netlist generating step 20 produces a netlist of the gate level design. A physical design step 22 determines the geometry of the integrated circuit. A fabrication and manufacturing step 24 generates the custom integrated circuit.

If a general purpose processor (not shown) is used in the custom integrated circuit, additional steps are required. There is a software implementation step 26 where the functional design is coded in software. A hardware/software coverification step 28 verifies the hardware and software implementations. There is also a system integration step 30 that links the hardware and software steps. These steps can add more than 30% to the design cycle.

Today, the custom integrated circuit design cycle 10 typically takes 6–15 months to complete and may cost between one and three million dollars. There are many transformation, analysis and verification steps in the design cycle 10. The design cycle 10 also has potentially time consuming and expensive iterations. Customer modifications or problems occurring during the design cycle may require costly redesign and long delays.

Because of the trend towards increased product functionality in the electronic industry, the complexity of custom integrated circuits is rapidly increasing. The level of skill required to generate custom integrated circuits and the design cycle time is also rapidly increasing. Consequently, prior art methods of generating custom integrated circuits are becoming increasingly inadequate. There currently exists a need for a method of generating application specific integrated circuits that reduces the design cycle time of custom integrated circuits. There also exists a need for a method of generating application specific integrated circuits that allows for modification during the design cycle.

SUMMARY OF THE INVENTION

It is therefore a principal object of this invention to greatly reduce the number of steps that it takes to produce an application specific integrated circuit and, therefore, to greatly reduce the design cycle time and the manufacturing cost. It is another object of this invention to provide a method of generating an application specific integrated circuit that easily implements design modifications during the design cycle.

It is another object of this invention to reduce the engineering skill level required to create an application specific integrated circuit. A principal discovery of the present invention is that a custom integrated circuit can be produced by programming a fixed architecture integrated circuit using a high-level object oriented programming language. It is another principal discovery that a custom integrated circuit can be produced by as little as two steps comprising describing the desired functionality of the integrated circuit in an object oriented programming language and compiling the object oriented program onto the fixed programmable architecture.

It is yet another principal discovery that a compiler can be used to perform high level synthesis to map specific functions of an application onto task engines comprised of set data paths in the PSA IC thereby eliminating time intensive analysis of possible data path.

Accordingly, the present invention features a method for generating an application specific integrated circuit that includes providing a software configurable semiconductor integrated circuit having a fixed hardware architecture. The architecture includes a plurality of task engines that executes microtask instructions. The microtask instructions may comprise a Very Long Instruction Word (VLIW) program. The microtask instructions may also be loaded into program memory associated with particular task engines.

A user created high-level language program may be provided that defines the application specific integrated circuit. The high-level language may be an object oriented programming language such as the Java programming language. At least one object oriented class library that performs algorithms, data communications or data manipulations may be provided. The high-level program may be mapped to particular task engines to implement a communication protocol for at least one of an input or an output interface of the fixed hardware architecture.

A high-level language compiler is provided that compiles the high-level language program. The compiler parses the program into a plurality of microtasks that instruct the plurality of task engines to implement the application specific integrated circuit. The program may be parsed into a plurality of threads that are subsequently decomposed into microtasks. The compiler may be optimized to select an optimum task engine for each of the microtasks. For example, the compiler may insert direct memory data references in each of the microtasks. A schedule of multiple microtasks may be statically defined.

The present invention also features a method for generating an application specific integrated circuit. The method includes providing a software configurable semiconductor integrated circuit having a fixed hardware architecture. The hardware architecture includes a plurality of task engines.

A user created high-level language program is provided that defines the application specific integrated circuit. A high-level language compiler is also provided that compiles the high level language program. The compiler parses the program into a plurality of microtasks that instruct the plurality of task engines to implement the application specific integrated circuit.

The present invention also features an apparatus for generating an application specific integrated circuit that includes a semiconductor integrated circuit having a fixed hardware architecture. The hardware architecture includes a plurality of task engines. The plurality of task engines are programmable with a VLIW instruction set that may be unique to each particular task engine. At least one task engine may be included that programs an input and an output interface for accepting data with a communication protocol. The hardware architecture may also include a program memory associated with each of the task engines for storing microtasks for instructing the task engines.

A high-level language compiler compiles a user created high-level language program that defines the application specific integrated circuit. The compiler parses the program into a plurality of microtasks that instruct the plurality of task engines to implement the application specific integrated circuit. The apparatus may also include a software simulator that evaluates particular architectures.

BRIEF DESCRIPTION OF THE DRAWINGS

This invention is described with particularity in the appended claims. The above and further advantages of this invention may be better understood by referring to the following description taken in conjunction with the accompanying drawings, in which:

DETAILED DESCRIPTION

Figure 2:
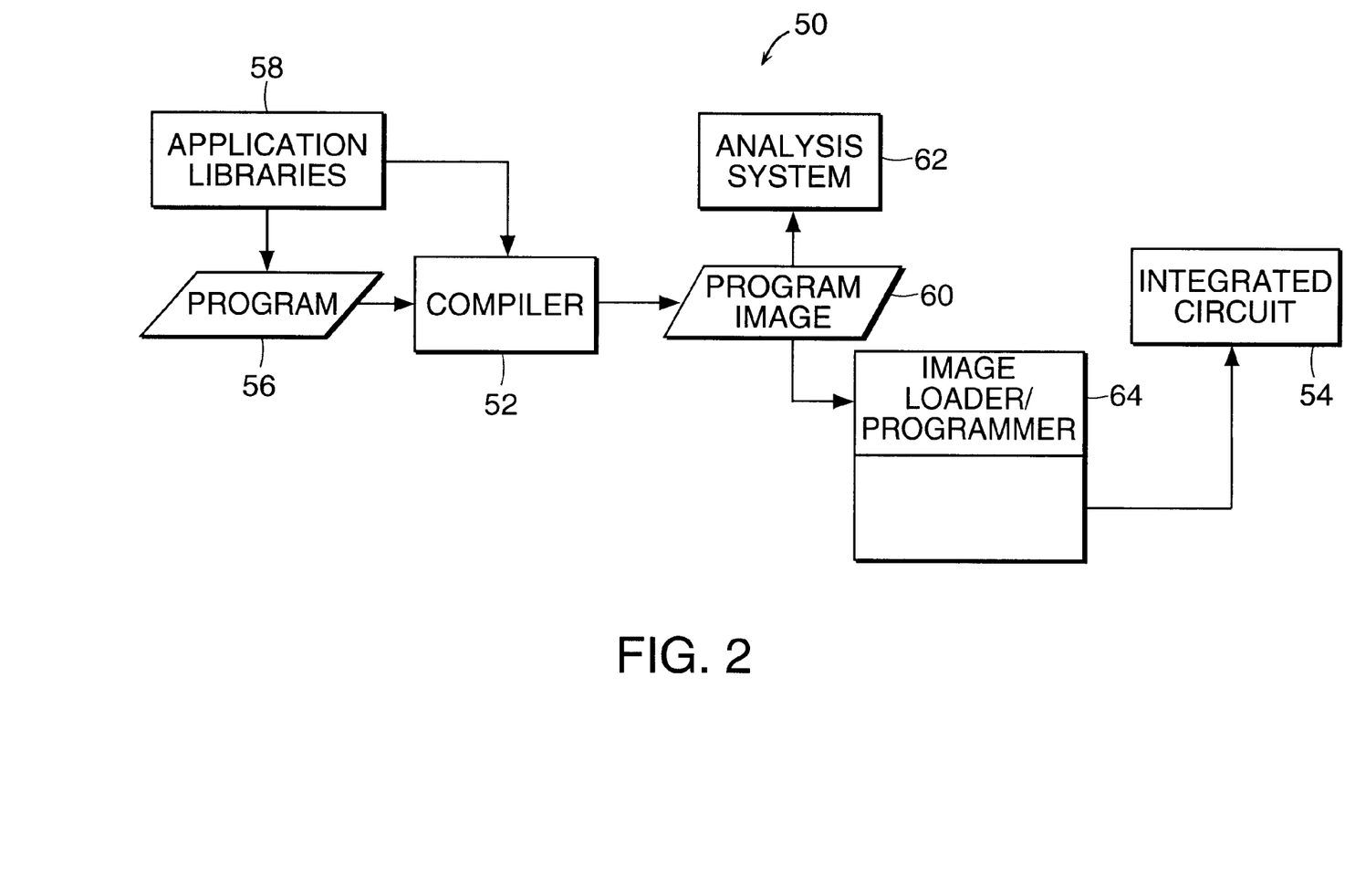
FIG. 2 is a block diagram of a method of generating application specific integrated circuits that embodies the invention.

FIG. 2 is a block diagram of a method of generating application specific integrated circuits (ASICs) 50 that embodies the invention. The method uses a specialized programmable system architecture (PSA) compiler 52 and PSA hardware integrated circuit (IC) 54 to generate the ASIC.

To generate the ASIC using the method of the present invention, an end user (not shown) develops a user program 56 that includes custom code which defines the system specification for the ASIC. The user program 56 may incorporate application libraries 58 of verified code that perform certain predetermined functions likely to be found in the target application. These application libraries 58 are essentially virtual intellectual property ("Virtual P") blocks.

In one embodiment, the application libraries 58 are Java class libraries. The object class libraries may include base libraries, component libraries and application framework libraries. The base libraries define a set of methods or functions for commonly used or utility functions, such as digital signal processing, image processing, math, and I/O functions. For example, the base libraries may include code for objects such as encoders, decoders, and filters.

The component libraries define a set of component objects that are used as building blocks in developing an application for the PSA IC. The component objects are class definitions derived from a base class. Each component object has predefined input and output channels. The component objects may include code for compression, coding, digital audio/video, connectivity, and switching functions. For example, component objects may include code for a JPEG codec, an MPEG codec, an ATM switch, or a USB bus slave.

The application framework libraries define a complete description of a system that can be run on a PSA IC. Examples of such systems are code multimedia, video conferencing, set top box and audio systems. Specifically, an application framework library may include code for image processing, user control and image compression functions of a digital camera.

Using application libraries 58 reduces the design cycle time and the level of skill required to produce the custom integrated circuit. Using the application libraries also improves system performance because the libraries are optimized for particular target task engines. In addition, using application libraries makes the system development more intuitive because users can design a system from high level blocks.

The user program 56 containing the custom code that defines the system specification for the ASIC and the application libraries 58 is parsed by the PSA Compiler 52. The PSA compiler 52 converts the user program 56 into a program image 60 of the system specifications for the ASIC that comprises a series of microtasks. Each microtask is a Very Long Instruction Word (VLIW) program for a target task engine in the PSA IC 54.

The PSA analysis system 62 is a graphical analysis environment that allows the user to analyze certain characteristics of their application running on a target PSA IC. It includes a PSA simulator, PSA configuration tool, and graphical user interface (GUI) environment. The PSA simulator is a software model of a specific configuration of the PSA IC hardware that can execute the program image 60 produced by the PSA compiler 52. The PSA configuration tool allows the user to select between different configurations of the PSA IC. The configuration information is used by the PSA compiler 52 and by the simulator to accurately reflect the characteristics of the target PSA IC 54. The graphical user environment allows the user to interact with the different analysis tools through a graphical windowing interface.

A PSA Image Loader/Programmer 64 loads the program image 60 into the PSA IC 54. This loads the binary program image into on-chip program memory on the PSA IC.

The PSA IC 54 is a configurable semiconductor device architecture that is programmable with the program image 60 produced by the PSA compiler 52. The architecture of the device comprises a series of task engines including high-performance data paths. The task engines communicate with each other through shared memories. The datapaths are controlled using Very Long Instruction Word (VLIW) instruction sets that are specific for that task engine.

The method of generating ASICs illustrated by FIG. 2 is advantageous because it greatly reduces the design cycle time. The method of FIG. 2 is also advantageous because the user program, rather than the hardware architecture, defines the application-specific functionality. This enables the creation of virtual application specific standard parts "Virtual ASSPs" using Virtual IP blocks residing in the application libraries.

Figure 3:
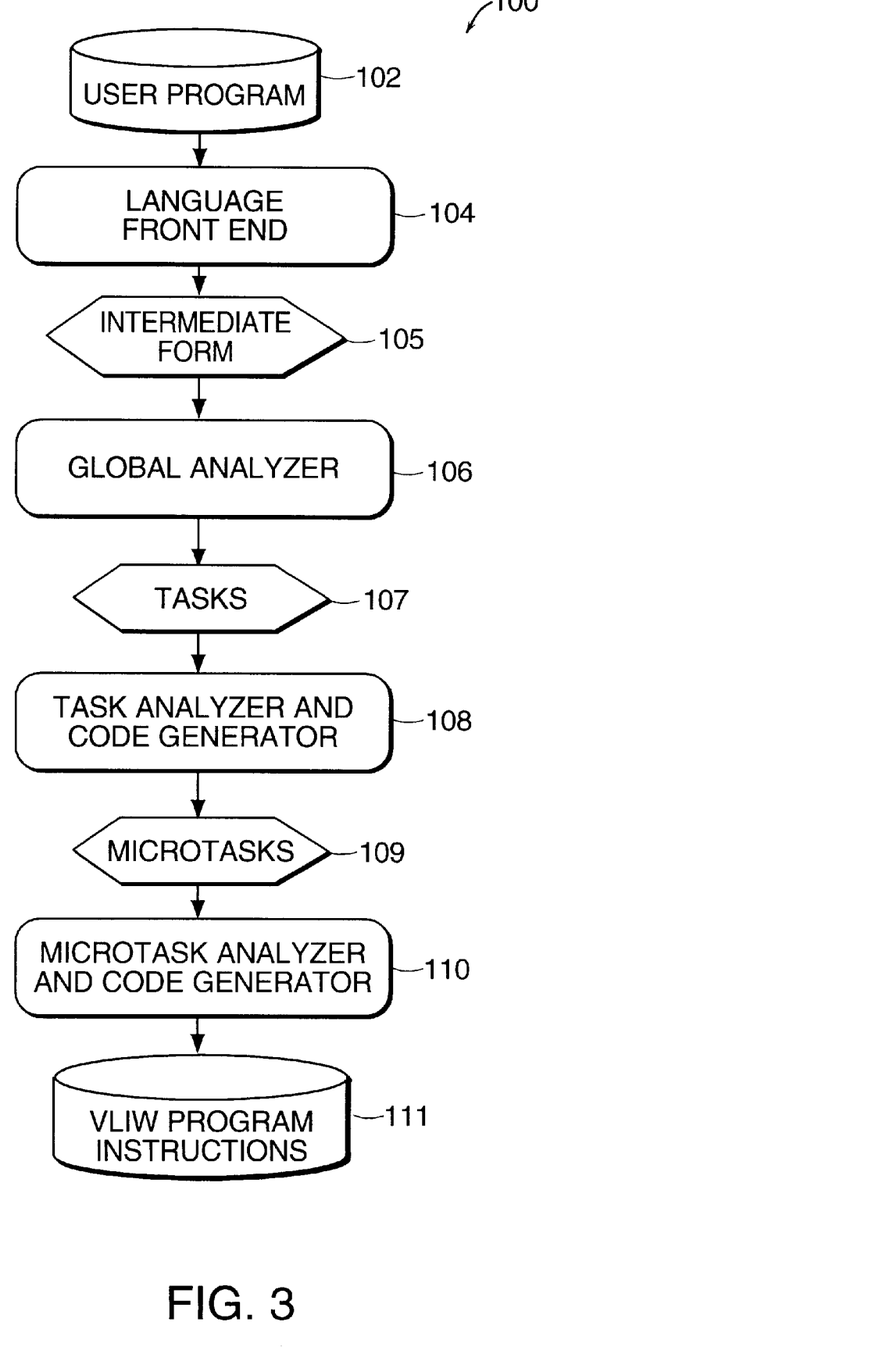
FIG. 3 illustrates a flow chart of the PSA compilation process.

FIG. 3 illustrates a flow chart of the PSA compilation process 100. The compilation process 100 is complex because the process maintains a knowledge of the input program objects, the tasks to implement those objects, and the memory to facilitate communication between those objects and the microtasks program images 60 (FIG. 2). In general, the compilation process uses high level synthesis to directly map specific functions of an ASIC onto data paths comprising predefined task engines in the PSA IC. This mapping eliminates time intensive analysis of every possible data path. In addition, the PSA compiler implements the control directly into the VLIW instruction stream rather than implementing the control flow in custom hardware. This allows for the creation of virtual ASIC components.

The user program 102 code is read by the language front end 104 which converts an ASCII file description of the user program into an intermediate form 105 which can be operated on by the compiler. A global analyzer 106 partitions the user program 102 into blocks of code (tasks 107) that are executable on particular target task engines that communicate through shared memories. In partitioning the user program 102, the global analyzer 106 performs numerous functions which are described below.

The global analyzer 106 performs memory analysis. The various tasks 107 communicate with each other through shared memories and utilize private memories for storing internal data. The global analyzer 106 allocates memory segments for communicating in shared memory and for local storage required by the task 107 in private memory. The global analyzer 106 also allocates memory locations based on data lifetime analyses.

The global analyzer 106 also performs datapath analysis. The global analyzer 106 determines the optimal task engines on which to execute the functionality of a given task. This is done by analyzing the required operations of the task 107 (addition, multiplication, etc.) and matching those to a task engine that can optimally support the collection of operations required by the task. For example, if a task includes a number of multiplication operations, the global analyzer 106 maps the task onto a task engine that includes a multiplier as one of its computation units.

The global analyzer 106 also performs task scheduling. The global analyzer 106 determines the relationships between tasks 107 and inserts code to efficiently order the execution of the tasks so as to optimize the control flow and data relationships between tasks. In addition, the global analyzer 106 performs system level optimization and allocation. That is, the global analyzer 106 processes the entire program (rather than individual modules) and makes global decisions and optimizations for program execution and memory references.

The global analyzer 106 also inserts direct memory references, rather than memory addressing, in the instruction set. Direct memory addresses can be used because the PSA IC hardware architecture implements the overall system including the memory used for data storage. Direct memory addressing is advantageous because it minimizes the number of required instructions and enables asymmetric pipelining of instructions. Finally, the global analyzer 106 generates intermediate forms that are data structures which define a network of tasks where each task is represented by a control/dataflow graph.

A task analyzer and code generator 108 processes the tasks 107 allocated to specific task engines and generates a series of microtask definitions that run on particular task engines. The microtasks 109 are atomic execution units that are non-preemptive. That is, once they are executed, they will run to completion without being interrupted. In one embodiment, the task analyzer and code generator 108 uses program decomposition techniques to decompose tasks into threads and then, through data flow analysis, decompose the threads into microtasks. The task analyzer and code generator 108 also generates instructions, referred to as "meta-code," that define a virtual machine for the target task engine.

In addition, the task analyzer and code generator 108 determines how a task should be partitioned into microtasks taking into consideration the number of instructions, the flow of control, dependencies on external data and opportunities for software pipelining. The microtasks are then assigned onto specific computation units defined for the target task engine.

The task analyzer and code generator 108 performs numerous local optimization techniques, such as redundant code elimination. For example, if a method from a baseline library is used in multiple objects, the compiler might locate the instructions for executing that method in one location rather than distributing multiple copies throughout the program. The task analyzer and code generator may also perform other optimization techniques such as code motion, inline expansion, and loop unrolling.

A microtask analyzer and code generator 110 reads the microtasks and the meta-code generated by the task analyzer and code generator 108 and then generates the actual Very Long Instruction Word (VLIW) program instructions 111 for the task engine and the loadable image. The microtask analyzer and code generator 110 performs various optimization tasks.

The microtask analyzer and code generator 110 optimizes the microtasks 109 for parallelism if multiple computation units are in the target task engine. Rather than executing each operation in sequence, the microtask analyzer and code generator 110 determines operations which can be executed independent of each other and allocates these operations to different computation units. These operations can then be executed in the same instruction cycle as each other so that, for example, two or three operations can execute in a single cycle rather than two or three cycles.

The microtask analyzer and code generator 110 also performs instruction compression. The instruction streams are compressed into a form which requires less memory for storage. The compression scheme is optimized for typical instruction sequences. Known table-based compression techniques referred to as "entropy" encoders may be used.

Figure 4:
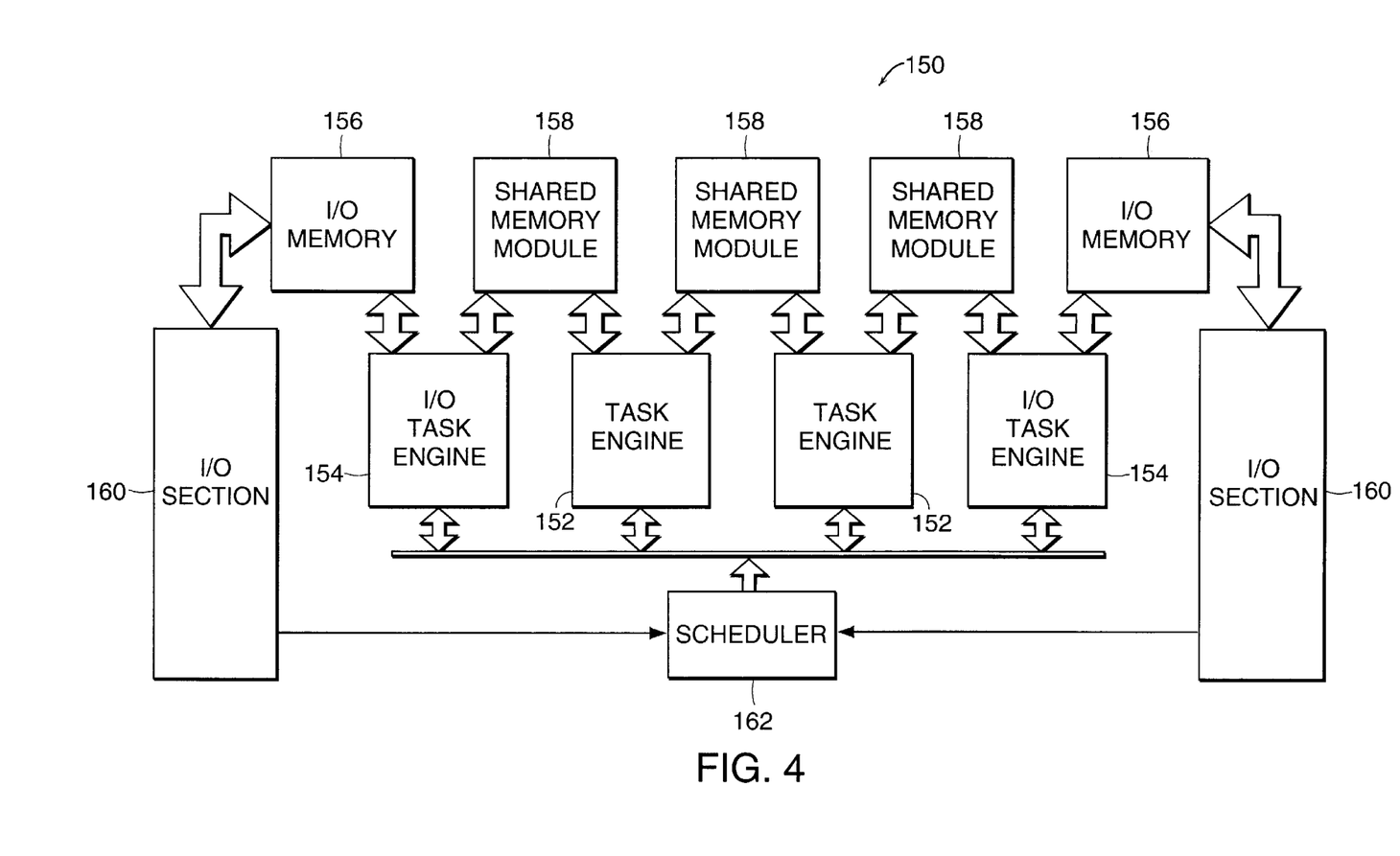
FIG. 4 illustrates a schematic block diagram of the PSA hardware architecture 150.

FIG. 4 illustrates a schematic block diagram of the PSA hardware architecture 150. The PSA hardware 150 is a configurable hardware architecture that comprises a series of task engines 152 with predefined communication mechanisms and memory structures. The task engines 152 are high performance data paths that are programmed with a Very Long Instruction Word (VLIW). Programming with VLIWs allows the compiler to select the optimum task engine to perform some part of the ASIC operation.

The task engines 152 are optimized for different types of tasks. Some tasks will require advanced processing capabilities and, therefore, will require ALUs and multipliers in the task engine's datapath. Other tasks may simply be used to transform sequences of data and, therefore, will require only a simple datapath consisting of little more than a shift register.

The PSA hardware 150 can communicate with a diverse range of other circuits through various protocols. The inputs and outputs of the PSA hardware 150 are programmed using special input/output task engines 154 (I/O task engines) that interface with input/output memory (I/O memory) 156. The I/O memory 156 is random-access memory (RAM) that stores data that is input from and output to external pin modules (not shown) of input/output sections 160 (I/O sections). In one embodiment, there are at least two I/O memories 156 interfacing with at least two I/O sections 156.

In one embodiment, the external pin modules are configurable through pin configuration registers. The I/O task engines 154 associated with the I/O memory 156 and the I/O section 160 can be programmed to write new values into these configuration registers in order to configure the operation of the pin module.

In one embodiment, the pin-to-memory-location mapping of the PSA hardware 150 is predefined (i.e., not programmable). The predefined mapping allocates one or more pins into a word memory location. Pins may be bundled so that, for example, 16 pin values may be mapped into a single word. This enables programs to allocate sets of pins to commonly bundled values (e.g., data busses).

The task engines 152, including the I/O sections 160, communicate by the shared memory modules 158. The shared memory modules 158 are typically random-access memories (RAM) that can be written to and read from by the task engines. Communication between tasks is performed by having one task write to and another task read from the shared memory 158.

A scheduler 162 manages the initiation of tasks based on scheduling events. Scheduling events include: (1) a change in value on an input pin; (2) a timer event; or (3) a system reset event. When one or more of these events occurs, the scheduler 162 places a task (or a set of tasks) onto the task queue of one of the task engines 152.

In operation, each task engine 152 is programmed with a unique Very Long Instruction Word (VLIW) instruction set which can be used to directly program the flow of data through the datapath. In one embodiment, the PSA hardware 150 has two modes of operation, the programming mode and the normal mode. In the programming mode, microtask programs are moved into the instruction memories. The PSA hardware 150 routes the data presented to the I/O sections 160 of the PSA hardware 150 to the memories 158 for each of the task engines 152.

In the normal mode, the data presented to the I/O sections 160 of the PSA hardware 150 is latched. If a scheduling event occurs, any microtasks associated with that event are placed into a task queue. The microtasks on the task queue for each task engine are executed until the queue is empty. Output values are written to the I/O memory 160 associated with the appropriate output pin.

Figure 5:
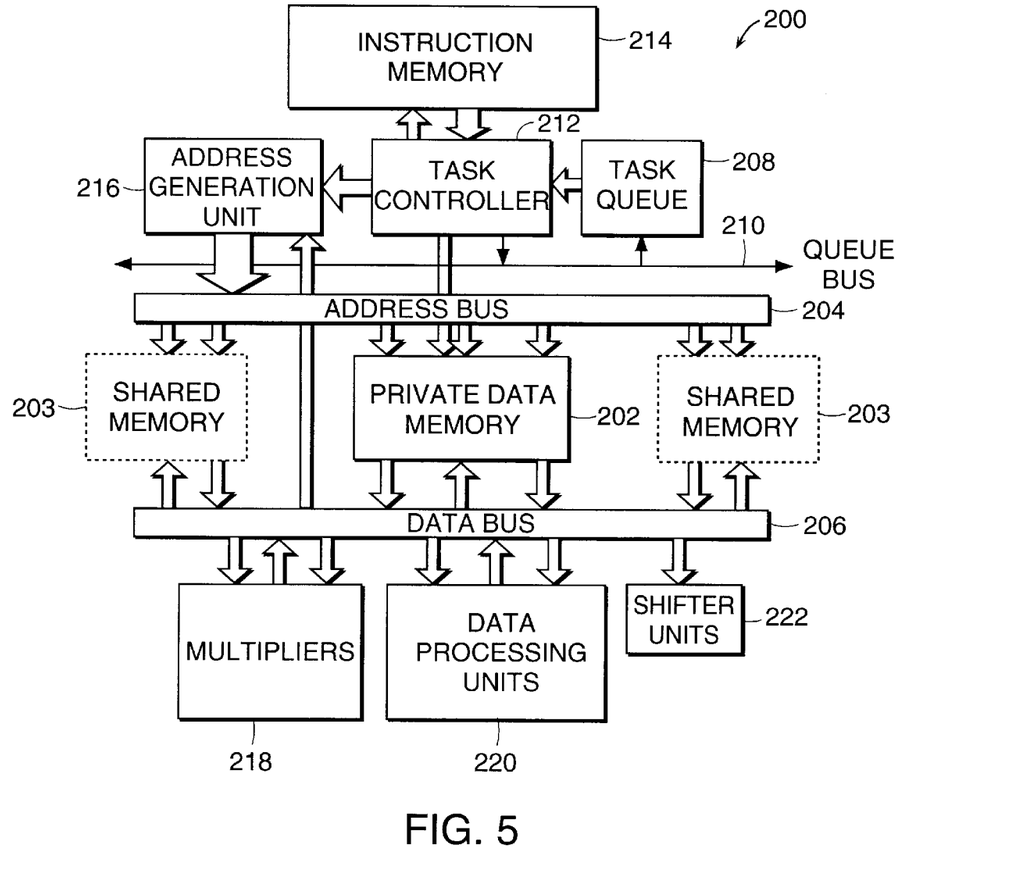
FIG. 5 illustrates a schematic block diagram of the task engine hardware architecture.

FIG. 5 illustrates a schematic block diagram of the task engine hardware architecture 200. Private data memory 202 stores data used internally by the task engine 200. The private memory 202 is random access memory (RAM) that communicates with an address bus 204 and a data bus 206. These buses are used to move data stored in memory locations to the inputs and from the outputs of the computation units.

The stored data may include variables of objects that are mapped onto the task engine 200, intermediate values that must persist between microtasks, and parameters to methods called within the tasks running on the task engine 200. In one embodiment, constant values which are required by the tasks are mapped into the private data memory 202. The values of these constants are established during an initialization sequence run on the task engine 200.

A task queue 208 is provided that is a first-in, first-out (FIFO) queue that schedules microtasks for execution. Task identifications that reference particular microtasks are placed in the task queue 208. The task queue 208 is in communication with a queue bus 210. The queue bus 210 allows the task engine 200 to receive tasks from the scheduler and other task engines connected to the queue bus 210.

A task controller 212 that is in communication with the task queue 208 and the data bus 206 manages the execution of microtasks that are stored on the task queue 208. The task controller 212 includes a program counter (not shown) that is updated to include the next microtask to run and manages the loading and execution of instructions for that microtask.

Instruction memory 214 is in communication with the task controller 200. The instruction streams for each microtask assigned to run on particular task engine 206 are loaded into the instruction memory for the particular task engine. In one embodiment, the instruction memory 214 is non-volatile memory such as flash memory.

An address generation unit 216 takes memory references from the task controller 212 and converts them to actual memory locations in either the private data memory 202 or in shared memories 203. There are two advantages to this approach: shorter immediate addressing saves program memory and vector address generation increases performance and saves execution resources. This causes the data in those memory locations to be made available to the appropriate data bus.

Different task engines are designed to have different configurations and types of computation units in communication with the data bus 206. A computation unit is an on-chip block which performs some computational function. Typical examples of computation units are multipliers 218, data processing units (DPUs) 220, and shifters units 222.

EQUIVALENTS

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A method for generating an application specific integrated circuit, the method comprising:
    a) providing a software configurable semiconductor integrated circuit having a fixed hardware architecture that includes a plurality of task engines and configurable I/O;
    b) providing a high-level language compiler; and
    c) compiling a user created high-level language program with the compiler that defines the application specific integrated circuit, the compiler parsing the program into a plurality of microtasks for instructing the plurality of task engines to implement the application specific integrated circuit.

2. The method of claim 1 further comprising providing the user created high-level language program that defines the application specific integrated circuit.

3. The method of claim 1 wherein the high-level language is an object oriented or component-based programming language.

4. The method of claim 3 further comprising providing at least one object oriented class library that is compilable with the high-level language compiler to generate microtasks for instructing task engines to perform algorithms, data communications or data manipulation.

5. The method of claim 3 wherein the object oriented programming language is a Java programming language.

6. The method of claim 1 wherein each of the microtasks comprises a Very Long Instruction Word program that instructs a task engine.

7. The method of claim 1 further comprising loading the microtasks into program memory associated with the task engines.

8. The method of claim 1 wherein the compiler is optimized to select an optimum task engine for each of the microtasks.

9. The method of claim 1 further comprising parsing a high level language program into a plurality of microtasks that instruct task engines to implement a communication protocol for at least one of an input or an output interface of the fixed hardware architecture.

10. The method of claim 1 further comprising statically defining a schedule of multiple microtasks.

11. The method of claim 1 wherein the step of compiling a user created high-level language program includes inserting direct memory data references in each of the microtasks.

12. The method of claim 1 wherein parsing the program into the plurality of microtasks comprises:
    a) parsing the program into a plurality of threads; and
    b) decomposing the treads into microtasks.

13. An apparatus for generating an application specific integrated circuit, the apparatus comprising:
    a) a semiconductor integrated circuit having a fixed hardware architecture including a plurality of task engines; and
    b) a high-level language compiler that compiles a user created high-level language program that defines the application specific integrated circuit, the compiler parsing the program into a plurality of microtasks for instructing the plurality of task engines to implement the application specific integrated circuit.

14. The apparatus of claim 13 wherein the plurality of task engines includes at least one task engine that programs an input interface for accepting data with a communication protocol.

15. The apparatus of claim 13 wherein the plurality of task engines includes at least one task engine that programs an output interface for providing data with a communication protocol.

16. The apparatus of claim 13 further comprising a software simulator for evaluating the mapping of an application onto a PSA IC.

17. The apparatus of claim 13 wherein the fixed hardware architecture further comprises a program memory associated with each of the task engines for storing microtasks for instructing the task engines.

18. The apparatus of claim 13 wherein each of the plurality of task engines is programmable with a unique Very Long Instruction Word instruction set.

19. A method for generating an application specific integrated circuit, the method comprising:
    a) providing a software configurable semiconductor integrated circuit having a fixed hardware architecture including a plurality of task engines;
    b) providing a high-level language compiler;
    c) providing a user created high-level language program for the high-level language compiler that defines the application specific integrated circuit; and
    d) compiling the program with the compiler, the compiler parsing the program into a plurality of microtasks for instructing the plurality of task engines to implement the application specific integrated circuit.

* * * * *